(12) United States Patent
Govorkov et al.

(10) Patent No.: US 8,611,383 B2
(45) Date of Patent: Dec. 17, 2013

(54) OPTICALLY-PUMPED SURFACE-EMITTING SEMICONDUCTOR LASER WITH HEAT-SPREADING COMPOUND MIRROR-STRUCTURE

(75) Inventors: Sergei Govorkov, Los Altos, CA (US); Luis Spinelli, Sunnyvale, CA (US)

(73) Assignee: Coherent, Inc., Santa Clara, CA (US)

( * ) Notice: Subject to any disclaimer, the term of this patent is extended or adjusted under 35 U.S.C. 154(b) by 281 days.

(21) Appl. No.: 13/093,585

(22) Filed: Apr. 25, 2011

(65) Prior Publication Data
US 2012/0269216 A1   Oct. 25, 2012

(51) Int. Cl.
*H01S 5/024* (2006.01)
*H01S 5/183* (2006.01)

(52) U.S. Cl.
USPC .......................... 372/36; 372/34; 372/50.124

(58) Field of Classification Search
USPC .......................... 372/36, 50.124, 34
See application file for complete search history.

(56) References Cited

U.S. PATENT DOCUMENTS

| | | |
|---|---|---|
| 5,436,920 A | 7/1995 | Minemoto et al. |
| 5,627,853 A | 5/1997 | Mooradian et al. |
| 6,097,742 A * | 8/2000 | Caprara et al. ............. 372/22 |
| 6,782,019 B2 | 8/2004 | Zheng |
| 6,822,988 B1 | 11/2004 | Okazaki et al. |
| 6,940,880 B2 | 9/2005 | Butterworth et al. |
| 7,397,829 B2 | 7/2008 | Yoo et al. |
| 2004/0179559 A1 | 9/2004 | Butterworth et al. |
| 2005/0036528 A1 | 2/2005 | Schmid |
| 2005/0190810 A1 | 9/2005 | Butterworth et al. |
| 2005/0276301 A1 | 12/2005 | Spinelli et al. |
| 2006/0280220 A1 | 12/2006 | Yoo |
| 2007/0110118 A1 | 5/2007 | Kim et al. |
| 2007/0116078 A1 * | 5/2007 | Kim ........................ 372/50.124 |
| 2007/0165690 A1 | 7/2007 | Yoo et al. |
| 2007/0268941 A1 | 11/2007 | Kim et al. |
| 2007/0291801 A1 | 12/2007 | Caprara et al. |
| 2008/0112443 A1 | 5/2008 | Lee et al. |
| 2009/0067453 A1 | 3/2009 | Mizuuchi et al. |
| 2011/0064099 A1 | 3/2011 | Govorkov et al. |

FOREIGN PATENT DOCUMENTS

EP    1255331 A1    11/2002

OTHER PUBLICATIONS

International Search Report and Written Opinion received for PCT Patent Application No. PCT/US2010/048076, mailed on May 16, 2012, 10 pages.
International Preliminary Report on Patentability received for PCT Patent Application No. PCT/US2010/048076, mailed on May 31, 2012, 7 pages.
Non Final Office Action received for U.S. Appl. No. 12/558,315, mailed on Nov. 7, 2011, 9 pages.
Final Office Action received for U.S. Appl. No. 12/558,315, mailed on Mar. 11, 2011, 13 pages.
Non Final Office Action received for U.S. Appl. No. 12/558,315, mailed on Oct. 4, 2010, 16 pages.

(Continued)

*Primary Examiner* — Jessica Stultz
*Assistant Examiner* — Michael Carter
(74) *Attorney, Agent, or Firm* — Morrison & Foerster LLP

(57) ABSTRACT

A gain-module for use in an OPS-laser includes a multilayer semiconductor gain-structure surmounting a multilayer compound mirror-structure. Within the multilayer compound mirror-structure is a relatively thick layer of diamond which serves as a heat-spreader.

17 Claims, 3 Drawing Sheets

(56) References Cited

OTHER PUBLICATIONS

Hastie et al., "High power CW red VECSEL with linearly polarized TEM00 output beam", Optics Express, vol. 13, No. 1, Jan. 10, 2005, pp. 77-81.

Hopkins et al. "High-power, (AlGaIn)(AsSb) semiconductor disk laser at 2.0 μm", Optics Letters, vol. 33, No. 2, Jan. 15, 2008, pp. 201-203.

Shu et al., Unpublished U.S. Appl. No. 13/084,235, filed Apr. 11, 2011 titled as, "Cooling Apparatus for Optically Pumped Semiconductor Laser", 25 pages.

Non Final Office Action received for U.S. Appl. No. 12/558,315, mailed on Jun. 7, 2011, 13 pages.

Chen et al., "Angular Filtering of Spatial Modes in a Vertical-cavity Surface-emitting Laser by a Fabry-Perot Etalon", Applied Physics Letters, vol. 74, No. 8, 1999, pp. 1069-1071.

Kim et al., "End-Pumped Vertical External Cavity Surface Emitting Laser", Proceedings of SPIE, vol. 6132, 2006, pp. 61320D-1-61320D-5.

International Search Report and Written Opinion received for PCT Patent Application No. PCT/US2012/34090, mailed on Jul. 20, 2012, 15 pages.

\* cited by examiner

US 8,611,383 B2

OPTICALLY-PUMPED SURFACE-EMITTING SEMICONDUCTOR LASER WITH HEAT-SPREADING COMPOUND MIRROR-STRUCTURE

TECHNICAL FIELD OF THE INVENTION

The present invention relates in general to optically pumped semiconductor lasers. The invention relates in particular to optically pumped, external-cavity surface-emitting semiconductor lasers.

DISCUSSION OF BACKGROUND ART

Optically pumped, external cavity, surface-emitting semiconductor lasers (OPS-lasers) are finding favor for diverse applications such as forensic science, video displays, optical inspection, and optical pumping of fiber-lasers. One advantage of such an OPS-laser is that the emitting wavelength thereof is arbitrarily selectable over a broad range of wavelengths through the visible portion of the electromagnetic spectrum into the infrared portion of the electromagnetic spectrum. Another advantage of such a laser is that it is relatively straightforward to operate in a single longitudinal mode to provide a very high quality output beam.

A fundamental component of an OPS-laser is what is commonly termed an OPS-chip or OPS-structure. One preferred OPS-structure includes an epitaxially-grown, multilayer mirror-structure surmounted by an epitaxially-grown, semiconductor gain-structure. After the mirror-structure and gain-structure are grown, the growth substrate is etched away and the chip is bonded mirror-side down to heat-sink substrate, usually a relatively massive copper block. A diamond heat-spreader is typically located between the mirror-structure and the copper block.

An OPS-laser-resonator is usually formed between the mirror-structure of the OPS-chip and a separate conventional mirror, axially spaced-apart from the chip. The power output of the resonator is typically limited by the ability of the diamond heat-spreader and copper block to remove heat from the chip. This heat is generated by power absorbed in the gain-structure that is not extracted as laser radiation. The mirror-structure impedes the extraction of that heat. As pump power is increased, output-power of the resonator rises until heat can no longer be effectively removed, at which point, power output drops dramatically due to free-carrier absorption by the gain-structure. This is called "thermal roll-off" by practitioners of the art.

Fortunately, epitaxially grown mirror-structures, structures formed from alternating layers of gallium arsenide (GaAs) and aluminum arsenide (AlAs), can provide both high reflectivity and reasonable thermal conductivity at wavelengths between about 870 nanometers (nm) and 1100 nm. Such structures, of course are grown on a GaAs substrate. No other semiconductor systems, for example indium phosphide (InP) and gallium antimonide (GaSb), which would be used for longer wavelength OPS-structures offer such a fortunate combination. Coupled with the problem presented by the mirror-structure impeding heat extraction, is the fact that the thermal impedance of a mirror-structure increases with increasing wavelength. This is because quarter-wave optical thickness layers of the mirror-structure become physically thicker with increasing wavelength. Further, the efficiency of OPS gain-structures decreases with increasing wavelength, which increases heat generated at a given pump-power.

There is need for an efficient cooling arrangement for OPS-chips. The cooling arrangement should increase the pump-power at which thermal roll-off occurs in general. The arrangement should also facilitate use of the thicker mirror-structures and poorly conducting semiconductor materials needed for OPS-lasers operating at fundamental wavelengths longer than 1100 nm or shorter than 900 nm.

SUMMARY OF THE INVENTION

The present invention is directed to a gain-module for an optically-pumped semiconductor laser. In one aspect of the invention, the gain-module comprises a multilayer semiconductor gain-structure including a first plurality of active layers spaced apart by spacer layers. The gain-structure surmounts a compound mirror-structure. The compound mirror-structure is in thermal communication with a heat-sink. The compound mirror-structure includes a second plurality of layers of material adjacent the gain-structure and is partially reflective and partially transmissive at a fundamental wavelength characteristic of the gain-structure. A layer of diamond is bonded to the first mirror. A third plurality of layers adjacent the layer of diamond is configured such that the compound mirror is highly reflective at the fundamental wavelength.

In one example of the inventive gain-module, the gain-structure includes active layers of indium gallium arsenide (InGaAs) spaced apart by spacer layers of gallium arsenide phosphide GaAsP. The second plurality of layers includes five pairs of layers alternating aluminum arsenide (AlAs) and GaAs and has a reflectivity at the gain-structure of about 93.5% and a transmission of about 6.5%. The diamond layer has a thickness of about 1.0 millimeters (mm). The third plurality of layers includes between about 15 and 30 layer-pairs of AlAs and GaAs, giving the compound mirror a reflectivity greater than about 99.7% at the gain-structure.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

DETAILED DESCRIPTION OF THE INVENTION

Figure 1:
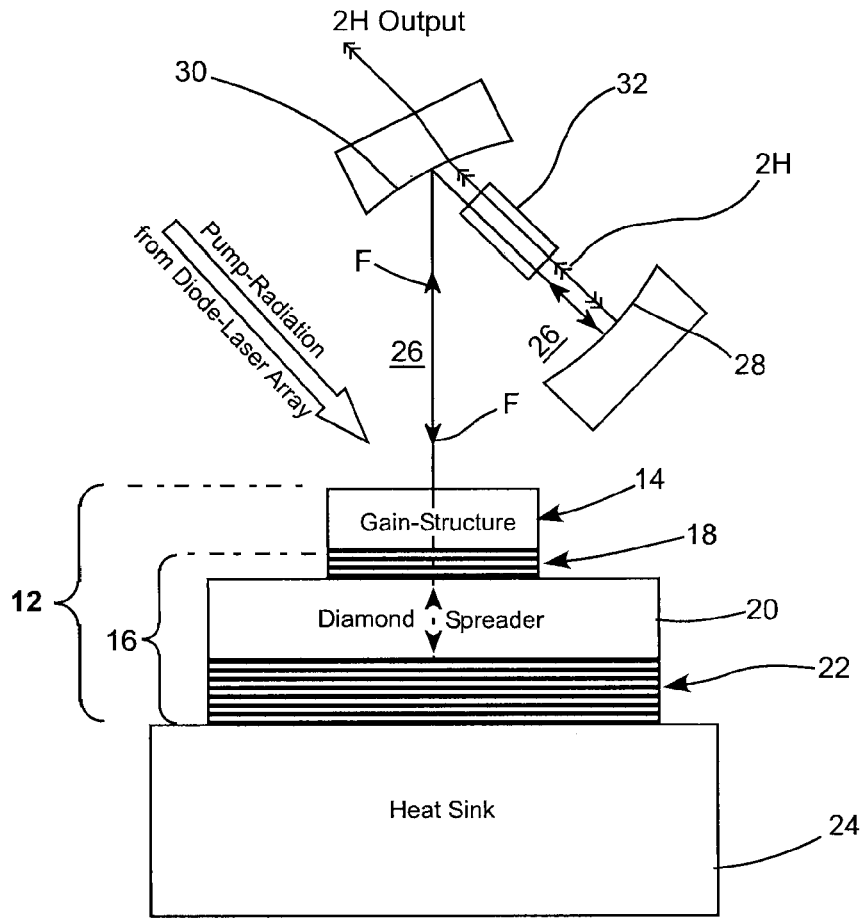
FIG. 1 schematically illustrates one preferred embodiment of an OPS-laser in accordance with the present invention including an OPS-structure (gain-module) having a multilayer semiconductor gain-structure surmounting a compound mirror-structure including a thick diamond layer, with a laser-resonator formed between the compound mirror-structure and another mirror, the resonator including the gain-structure of the OPS-structure.

Referring now to the drawings, wherein like components are designated by like reference numerals, FIG. schematically illustrates a preferred embodiment 10 of an OPS-laser in accordance with the present invention. Laser 10 includes an OPS-structure 12 in thermal contact with a heat-sink 24.

Structure 12 may also be referred to as a gain-module. The OPS-structure is preferably soldered to the heat-sink with a hard solder such as a gold-tin (AuSn) solder or the like.

The OPS-structure includes an epitaxially grown, multi-layer semiconductor, surface emitting, gain-structure 14, including a plurality of active or quantum-well layers (not shown in FIG. 1) separated by pump-radiation absorbing spacer-layers (not shown in FIG. 1). A detailed description of such a gain-structure is not necessary for understanding principles of the present invention and accordingly is not presented herein. A detailed description of such gain-structures is present in U.S. Pat. No. 6,097,742, assigned to the assignee of the present invention, and the complete disclosure of which is hereby incorporated herein by reference.

Gain-structure 14 surmounts a compound mirror-structure 16. The compound mirror-structure and a concave mirror 28 form a laser resonator 26. Laser 10 is optically pumped by radiation delivered into the gain-structure as indicated in FIG. 1. A preferred source of the pump-radiation is a diode-laser array. The optical pumping causes laser radiation to circulate in resonator 26 as indicated by arrowheads F. The fundamental radiation has a wavelength characteristic of materials of gain-structure 14.

In this example, resonator 26 is folded by concave a fold-mirror 30. Mirror 30 is maximally reflective at the wavelength of radiation F and highly transmissive at the second-harmonic (2H) wavelength of the fundamental radiation. An optically nonlinear crystal 32 is located between mirrors 28 and 30 and converts a portion of fundamental radiation F to second-harmonic radiation on a double pass through the optically nonlinear crystal. The second-harmonic radiation, designated by double arrowheads 2H, is delivered out of resonator 26 by transmission through mirror 30. The fundamental and 2H-radiations propagate linearly in practice, but are shown spaced apart in FIG. 1, for convenience of illustration.

Compound mirror-structure 16 includes a partial-reflector (partially reflecting and partially transmitting) 18, formed by alternating layers of a relatively high refractive index material and a relatively low refractive index material. The layers have a thickness of about one-quarter wavelength at the fundamental wavelength. The significance and a preferred range of reflectivity values for partial reflector 18 are discussed in detail further hereinbelow. Transmission values of the mirror will be about 1.0 minus the reflection value and some relatively small amount of absorption. The amount of absorption, of course, will depend on the materials of the partial reflector. Partial reflector 26 is bonded to a diamond heat-spreader 20. The diamond heat-spreader surmounts a highly reflective (HR) multilayer mirror 22. Reflector 22 has a reflectivity sufficiently high that compound mirror-structure 16, at the gain-structure, has a peak-reflectivity at the fundamental wavelength preferably greater than about 99.8% (0.998). The diamond heat-spreader provides a relatively very thick layer in the mirror-structure which adds a high-frequency modulation of the reflectivity of the compound mirror-structure. This is discussed in detail further hereinbelow.

The placement of diamond-layer (heat-spreader) within the mirror-structure 20, with a relatively thin portion of the mirror-structure (partial reflector 26) between the gain-structure and the diamond greatly reduces thermal resistance between the gain-structure and the diamond compared with prior-art, diamond heat-spreader cooled OPS-structures, wherein the highly reflective mirror-structure is entirely between the gain-structure and the diamond heat-spreader. In the inventive mirror-structure 16, when the heat is spread quickly into the diamond, the thermal resistance of highly of reflective portion 22 of the mirror-structure is significantly less problematical. In addition, heating in the gain structure is typically concentrated in the region below the pump beam spot so that the heat transferred to the heat spreader 20 travels laterally to dissipate more quickly. In a preferred embodiment, the lateral dimensions of the heat spreader 20 can be larger than the lateral dimensions of the gain structure to enhance this effect. In particular, the lateral dimension of the heat spreader can be at least 1.5 times greater than the lateral dimensions of the gain structure.

Figure 2:
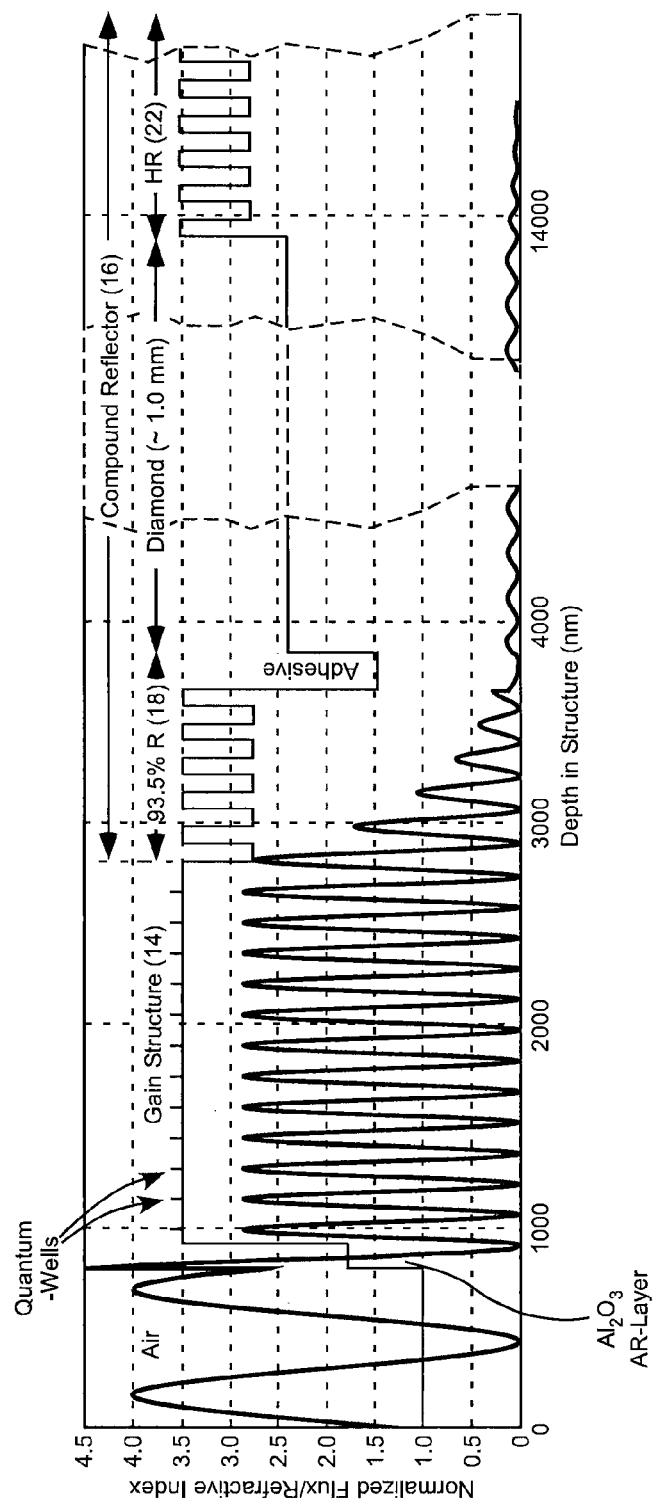
FIG. 2 is a graph schematically illustrating calculated, normalized fundamental radiation flux and refractive index as a function of thickness in one example of OPS-structure of FIG. 1.

FIG. 2 is a graph schematically illustrating calculated, normalized fundamental radiation flux (bold curve) and refractive index (fine curve) as a function of thickness (depth in the structure) in one example of OPS-structure of FIG. 1. Here, the structure is designed to have a peak-gain at a wavelength of about 1054 nm. The gain-structure includes twelve quantum-well layers of InGaAs separated by spacer layers of GaAsP. The quantum-well layers have a thickness of only about 10 nm and, because of this, appear on the refractive index plot simply as short vertical lines. There is a quarter-wave (optical thickness) layer of $Al_2O_3$ on top (air-side) of the gain-structure. This $Al_2O_3$ layer serves as an antireflection (AR) layer. In the gain-structure, the radiation-flux peaks are aligned with the quantum-well layers. The gain-structure has a physical thickness slightly less than 2.0 µm (2000 nm), as indicated.

Partial reflector 18, here includes five pairs of quarter-wave optical thickness (at 1054 nm) of aluminum arsenide (AlAs) having a refractive index of about 2.75 and GaAs having a refractive index of about 3.5. At this position in the structure, this arrangement provides a reflectivity of about 93.5% and a transmission of about 6.5%. Bonded to this partial reflector by an adhesive layer is the relatively thick diamond layer (heat-spreader layer), here having a thickness of about 1.0 mm. The adhesive layer, here, is assumed to be formed from a sol-gel having a refractive index of about 1.5. Any other adhesive transparent at the peak-gain (lasing) wavelength may be used without departing from the spirit and scope of the present invention. A preferred thickness for diamond heat-spreader layer 20 is preferably between about 0.1 mm and 2.0 mm, and more preferably between about 0.2 mm and about 1.5 mm, depending, inter alia, on the diameter of the pump-radiation and laser mode on the gain-structure.

It should be noted that in a prior-art OPS-structure, the gain-structure surmounts a mirror-structure having a reflectivity at the lasing wavelength of greater than about 99.9%. Using AlAs—GaAs layer-pairs, as used in partial reflector 18, this would require twenty layer-pairs for a total thickness of about 3.0 µm. This would create a thermal resistance between the gain-structure and a diamond-heat spreader at least four-times that created by partial reflector 18.

On the surface of the diamond layer opposite that on which the partial reflector is located, highly-reflecting (HR) mirror coating 22 is deposited. This coating must have sufficient reflectivity that the reflectivity of compound mirror-structure 16 at the lasing wavelength is preferably greater than about 97%, more preferably greater than about 99.8%, and even more preferably at least about 99.9%. In the example of FIG. 2, it is assumed that the HR coating has a reflectivity of greater than 99.8% and is provided by fifteen (15) pairs of AlAs and GaAs layers. In the example of FIG. 2, it can be seen that the flux at the lasing wavelength in the diamond layer is relatively low, i.e., only about 5% of the peak-flux in the gain-structure. This provides that the diamond layer does not need to be of a particularly high optical quality to function as an effective layer in compound mirror-structure 16.

Figure 3:
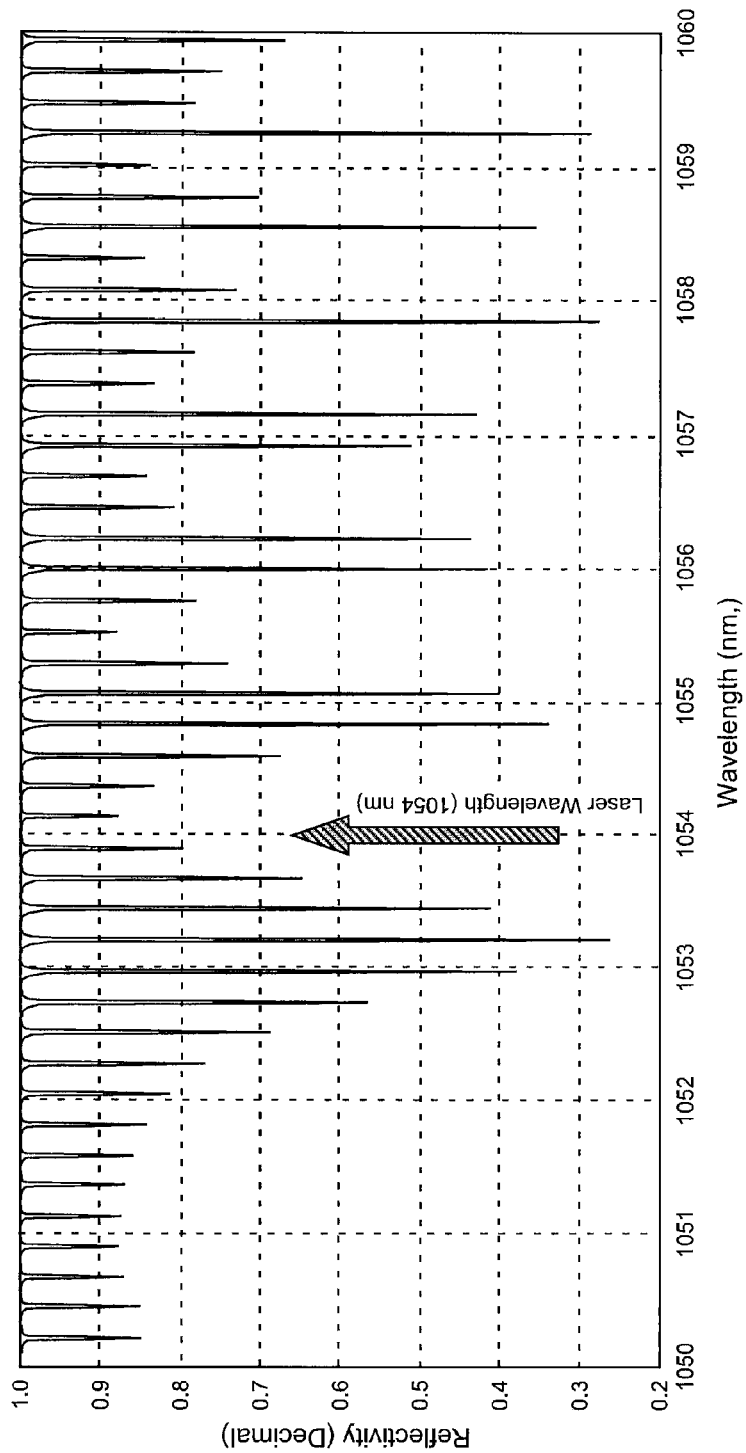
FIG. 3 is graph schematically illustrating calculated reflectivity of the compound-mirror-structure as a function of wavelength near the peak gain of the gain-structure in the example of the OPS-structure of FIG. 2.

FIG. 3 is graph schematically illustrating calculated reflectivity of compound mirror-structure 16 as a function of wavelength near the peak-gain of the gain-structure in the example of the OPS-structure of FIG. 2. The gain-structure, here, would have a gain-bandwidth (FWHM) of about 30 nm.

It can be seen that the reflectivity is generally very high across the 10-nm extent of the graph, but is modulated by regularly spaced, narrow band, reflection troughs with a spacing of about 0.25 nm therebetween. This modulation interval results from the thickness of diamond layer (heat-spreader) 20. The FWHM width of the reflectivity troughs is a function of the diamond thickness and the reflectivity values of the partial reflector and high reflector. The modulation depth is irregular and the irregularity is due to combined optical-interference effects of the diamond-layer and reflective components of the compound mirror-structure, and the gain-structure.

Based on the principle of lasing at the wavelength of lowest losses, a laser incorporating the inventive OPS-structure would find a fundamental lasing wavelength near the peak-gain wavelength between adjacent reflectivity troughs, in this example, at 1054 nm, as indicated in the graph FIG. 3. The modulation depth here is sufficient to minimize a tendency of the fundamental lasing wavelength to "hop" between reflectivity troughs. In the frequency doubled laser of FIG. 1 a birefringent filter or the like (not shown) may be required to keep the fundamental wavelength within the acceptance bandwidth (for 2H-conversion) of optically nonlinear crystal 32.

In selecting a reflectivity value for partial reflector 18, different criteria must be taken into account. Clearly, for a given thermal conductivity of materials involved, the thinner the partial reflector the more effective will be transfer of heat from the gain-structure in to the diamond heat-spreader layer. If the reflectivity is too low, however, the optical flux transferred to the diamond layer will increase, which will require a corresponding increase in the optical quality of the diamond layer. If the reflectivity is too high, thermal transfer to the diamond layer will be compromised. Further, unless the optical quality of the diamond is relatively high, the reflectivity contribution of the HR to the total reflectivity of the compound mirror-structure will also be compromised.

Given the above-discussed trade-offs, the reflectivity for partial reflector 18 at the lasing wavelength, at the gain-structure, is preferably between about 50% and about 99%, and more preferably about 70% and about 98%. In absolute terms, the reflectivity of HR 22 at the lasing wavelength is preferably between about 95% and about 99.9%. In relative terms, the reflectivity of HR mirror 22 is preferably such that the peak-reflectivity reflectivity of compound mirror-structure 16 at the lasing wavelength, at the gain-structure, is preferably greater than about 99.7% and more preferably at least about 99.9%, as discussed above.

While partial reflector 18 and HR mirror 22 are exemplified in the foregoing discussion as being made from multiple layers of semiconductor materials, reflectors made from other materials or by other techniques could be substituted without departing from the spirit and scope of the present invention. By way of example, a reflector comprising a layer of a metal such as gold, silver, magnesium or aluminum surmounted by one or more high and low refractive index layer pairs could be substituted for HR reflector 22. A reflector including a sub-wavelength grating could be substituted for either partial reflector 18 or HR mirror 22. Further, while the inventive mirror-structure inventive OPS-structure is described with reference to FIG. 1 as a terminating mirror of an OPS-laser resonator, the OPS-structure could function as a fold mirror in a resonator terminated by conventional mirrors or be another OPS-structure and a conventional mirror.

In conclusion, the present invention is described above with reference to a preferred and other embodiments. The invention is not limited, however, to the embodiments described and depicted herein. Rather, the invention is defined by the claims appended hereto.

What is claimed is:

1. A gain-module for an optically-pumped semiconductor laser, comprising:
    a multilayer semiconductor gain-structure surmounting a compound minor-structure, the compound minor-structure being in thermal communication with a heat-sink; and
    the compound minor-structure including a first plurality of layers of material adjacent the gain-structure and being partially reflective and partially transmissive at a fundamental wavelength characteristic of the gain-structure, a layer of diamond bonded to the first mirror, and a second plurality of layers adjacent the layer of diamond and configured such that the compound minor is highly reflective at the fundamental wavelength and wherein the diamond layer facilitates heat transfer from the gain structure to the heat sink.

2. The module of claim 1, wherein the first plurality of layers has a reflectivity at the gain-structure between about 50% and about 99%, the diamond layer has a thickness between about 0.1 millimeters and about 2.0 millimeters, and the compound mirror-structure has a peak-reflectivity greater than about 99.7% at the fundamental wavelength.

3. The module of claim 2 wherein the gain structure includes active layers spaced apart by spacer layers and wherein the active layers are formed from InGaAs and the spacer layers are formed from GaAsP.

4. The module of claim 3, wherein the first plurality of layers in the compound mirror-structure includes alternating layers of AlAs and GaAs.

5. The module of claim 4, wherein the fundamental wavelength is about 1054 nm.

6. The module of claim 1 wherein the thickness of the first layers is about a quarter wavelength at the fundamental wavelength.

7. The module of claim 6 wherein the thickness of the second layers is about a quarter wavelength at the fundamental wavelength.

8. The module of claim 1 wherein the lateral dimensions of the diamond heat spreader are about 1.5 times the greater than the lateral dimensions of the gain structure.

9. An optically pumped semiconductor (OPS) laser, comprising:
    a gain-module including a multilayer semiconductor gain structure surmounting a multilayer mirror-structure, the gain-module being supported on a heat sink, with the mirror-structure between the gain structure of the heat sink;
    a laser-resonator formed by the mirror-structure of the gain-module and at least one other mirror; and
    wherein the multilayer minor-structure includes an intermediate layer of diamond having a thickness between about 0.1 millimeters and about 2 millimeters and wherein the diamond layer facilitates heat transfer from the gain structure to the heat sink.

10. The laser of claim 9 wherein multilayer minor-structure includes a first plurality of layers of material between the diamond layer and the gain-structure, the first plurality of layers being partially reflective and partially transmissive for the fundament-wavelength radiation, and a second plurality of layers between the diamond layer and the heat-sink and configured cooperative with the first plurality of layers such that the minor-structure is highly reflective at the fundamental wavelength.

11. The laser of claim 10, wherein the first plurality of layers has a reflectivity at the gain-structure between about 50% and about 99%, and the minor-structure has a peak-reflectivity greater than about 99.7% at the fundamental wavelength.

12. The laser of claim 11, further including a source of pump-radiation arranged to deliver optical pump radiation into the gain-structure of the gain-module thereby causing fundamental radiation having a wavelength characteristic of the gain-structure of the gain-module to circulate in the laser-resonator.

13. The laser of claim 12, further including an optically non-linear crystal located in the laser-resonator and arranged to convert circulating fundamental-wavelength radiation into radiation having a different wavelength, and wherein the laser-resonator is arranged to deliver the different-wavelength radiation as output radiation.

14. A gain module for an optically pumped semiconductor laser comprising:

a multilayer semiconductor gain structure;
a first set of semiconductor layers on one surface of the gain structure and arranged to provide a partial reflectivity at the fundamental wavelength of the gain structure of between 50% and 98%;
a diamond heat spreader thermally coupled to the first set of semiconductor layers;
a second set of layers formed on the diamond heat spreader on a surface opposed to the first set of layers and arranged to provide a reflectivity at the fundamental wavelength of at least 99%; and
a heat sink thermally coupled to the second set of layers.

15. A gain module as recited in claim 14 wherein the thickness of the layers in the first set is about a quarter wavelength at the fundamental wavelength.

16. A gain module as recited in claim 15 wherein the thickness of the layers in the second set is about a quarter wavelength at the fundamental wavelength.

17. A gain module as recited in claim 14 wherein the lateral dimensions of the diamond heat spreader are about 1.5 times the greater than the lateral dimensions of the gain structure.

* * * * *